United States Patent
Gieskes et al.

(10) Patent No.: US 6,820,325 B2
(45) Date of Patent: Nov. 23, 2004

(54) INTEGRATED AIR FLOW CONTROL FOR A PICK AND PLACE SPINDLE ASSEMBLY

(75) Inventors: Koenraad Alexander Gieskes, Binghamton, NY (US); Michael D. Snyder, Binghamton, NY (US); John E. Danek, Vestal, NY (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 10/271,761

(22) Filed: Oct. 17, 2002

(65) Prior Publication Data

US 2004/0074085 A1 Apr. 22, 2004

(51) Int. Cl.[7] ............................................... B23P 19/00
(52) U.S. Cl. ............................. 29/743; 29/740; 29/741; 29/739; 29/729; 29/DIG. 44; 294/64.1; 294/2; 414/737; 409/233
(58) Field of Search .......................... 29/729, 739, 743, 29/740, 721, DIG. 44; 409/233, 232, 234, 211; 414/752.1, 737, 752; 294/64.1, 2

(56) References Cited

U.S. PATENT DOCUMENTS

| 4,657,470 A | * | 4/1987 | Clarke et al. ............... 414/627 |
| 5,076,564 A | | 12/1991 | Marass |
| 5,195,235 A | * | 3/1993 | Mifuji ......................... 29/721 |
| 5,498,942 A | * | 3/1996 | Ijuin .......................... 318/567 |
| 6,036,415 A | * | 3/2000 | Sheehan et al. ............. 409/231 |
| 6,161,886 A | * | 12/2000 | Furuya et al. .............. 294/64.1 |
| 6,328,362 B1 | * | 12/2001 | Isogai et al. ................. 29/740 |
| 2004/0074085 A1 | * | 4/2004 | Gieskes et al. ............... 29/743 |

* cited by examiner

Primary Examiner—Minh Trinh
(74) Attorney, Agent, or Firm—Schmeiser, Olsen & Watts

(57) ABSTRACT

A spindle assembly for a component pick and place machine includes a housing containing a spindle for movement therein along a longitudinal axis of the spindle; the housing accommodating a valve for controlling the flow of air to an inner bore of the spindle; the inner bore of the spindle having an opening at one end for communicating the flow of air for picking and placing the components; and the flow of air from the valve to the inner bore of the spindle is internal to the housing through passageways.

10 Claims, 5 Drawing Sheets

INTEGRATED AIR FLOW CONTROL FOR A PICK AND PLACE SPINDLE ASSEMBLY

BACKGROUND OF THE APPLICATION

1. Field of the Invention

The present invention relates to a spindle driving assembly, and, more particularly, to a high speed system for use in a spindle driving assembly in a pick and place machine.

2. Description of the Related Art

The present invention relates primarily, although not exclusively, to machines known in the electronics assembly industry as pick and place machines. In a pick and place machine, a spindle mounted on a spindle assembly is brought into contact with a die or other electronic component in order to pick up the die or component. The spindle assembly is then moved to another location, where the die or component picked up by the spindle is then placed in an appropriate location for assembly.

In conventional pick and place machines, one type of spindle assembly utilizes a vacuum spindle. A vacuum spindle includes a nozzle at a tip at a lower end of the spindle. A vacuum is applied to the nozzle at the tip of the spindle in order to enable the spindle to pick up a die or component. The spindle is then moved to an appropriate location for placing the die or component. In order to detach the die or component from the spindle, a pulse of air, sometimes referred to as an air kiss, is applied to the nozzle in order to blow the die or component away from the tip of the spindle.

In conventional pick and place machines, the vacuum is created by applying pressurized air to a venturi, which in turn, creates a vacuum. The vacuum is then directed to the spindle for picking up components. In addition, in order to discharge the die or component, the pressurized air was also applied directly to the tip of the nozzle.

A conventional pick and place machine may have a pick and place head that includes a plurality of spindle assemblies in order to maximize assembly time. However, the conventional valve assemblies used in conjunction with a respective spindle assembly were relatively large. Accordingly, in order to fit as many spindle assemblies as possible in the pertinent portion of the pick and place head, the valve assembly was located remotely from the spindle assembly. A disadvantage of locating the valve assembly remotely from the spindle assembly is that the time required for a vacuum applied at the venturi to reach the tip of the nozzle added to the processing time of the pick and place machine.

Some conventional valve assemblies used in a pick and place head had an actuating time of approximately 4.5 milliseconds. Accordingly, in a conventional pick and place machine, when the actuating time is factored together with the distance that the valve assembly is located from the spindle assembly, the time for the vacuum to reach the required level, typically about 20 inches of mercury, is about 40 milliseconds.

In other conventional assemblies, the valves are mounted on the spindle head frame, but are connected to the spindles with tubes. Such an arrangement is difficult to assemble.

OBJECTS AND SUMMARY

Accordingly, it is an object of the present invention to provide a pick and place head for a pick and place machine, wherein the actuating time can be reduced.

It is a further object of the present invention to provide a spindle assembly for a pick and place machine, wherein the valve assembly is small enough so that it can be located adjacent the spindle in order to minimize the time required for the vacuum for air pressure to be applied to the nozzle tip.

It is still another object of the present invention to provide a valve assembly for a pick and place machine, wherein the actuating time of the valve can be reduced in order to minimize processing time.

According to one embodiment of the present invention, a spindle assembly for a component pick and place machine comprises a housing containing a spindle for movement therein along a longitudinal axis of the spindle; the housing accommodating a valve for controlling the flow of air to an inner bore of the spindle; the inner bore of the spindle having an opening at one end for communicating the flow of air for picking and placing the components; and the flow of air from the valve to the inner bore of the spindle is internal to the housing through passageways.

DETAILED DESCRIPTION OF THE PREFERRED EMBODIMENTS

Figure 1:
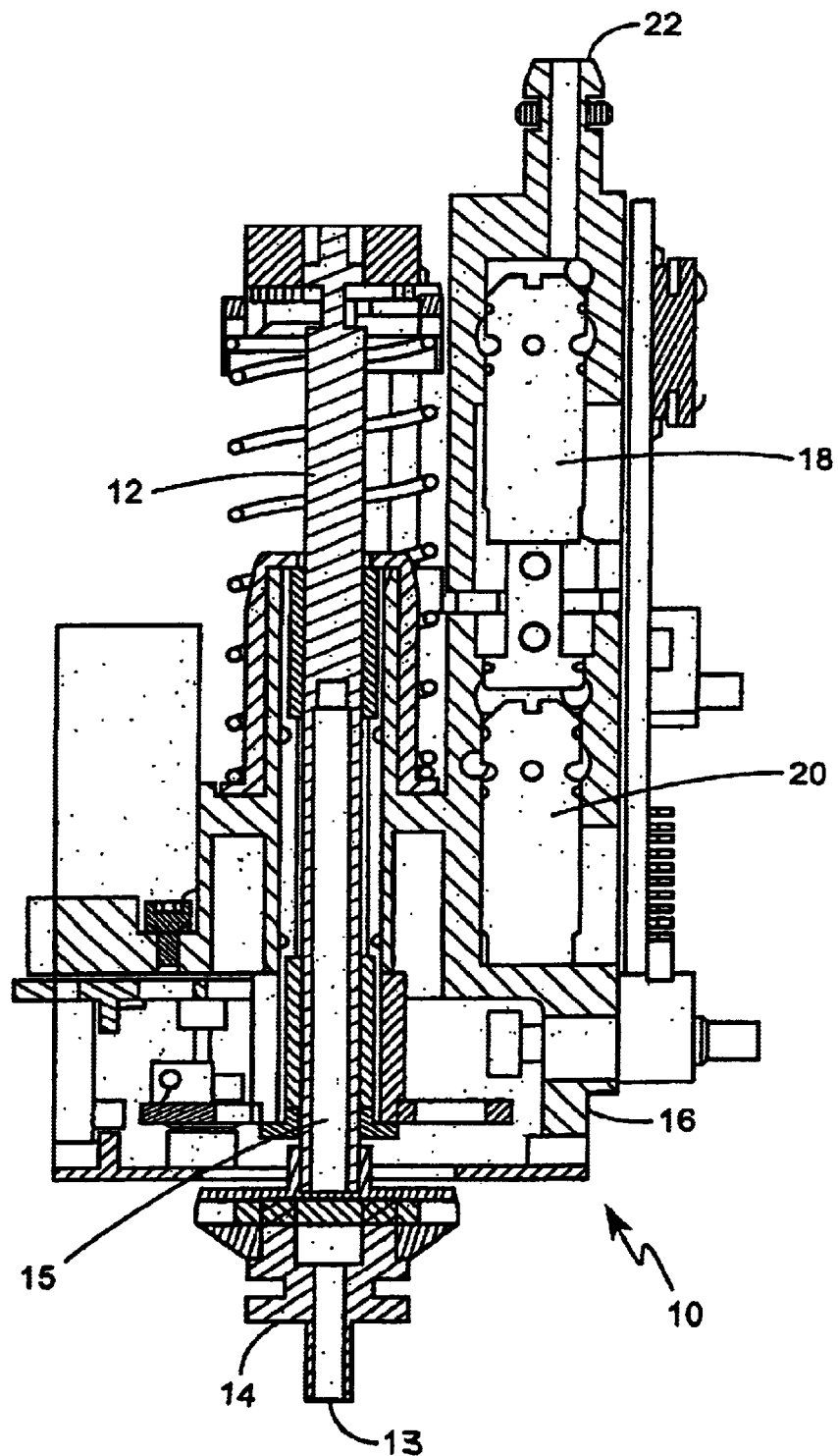
FIG. 1 is a cross-sectional view of a spindle assembly according to a preferred embodiment of the present invention, taken along line I—I of FIG. 2.
Figure 2:
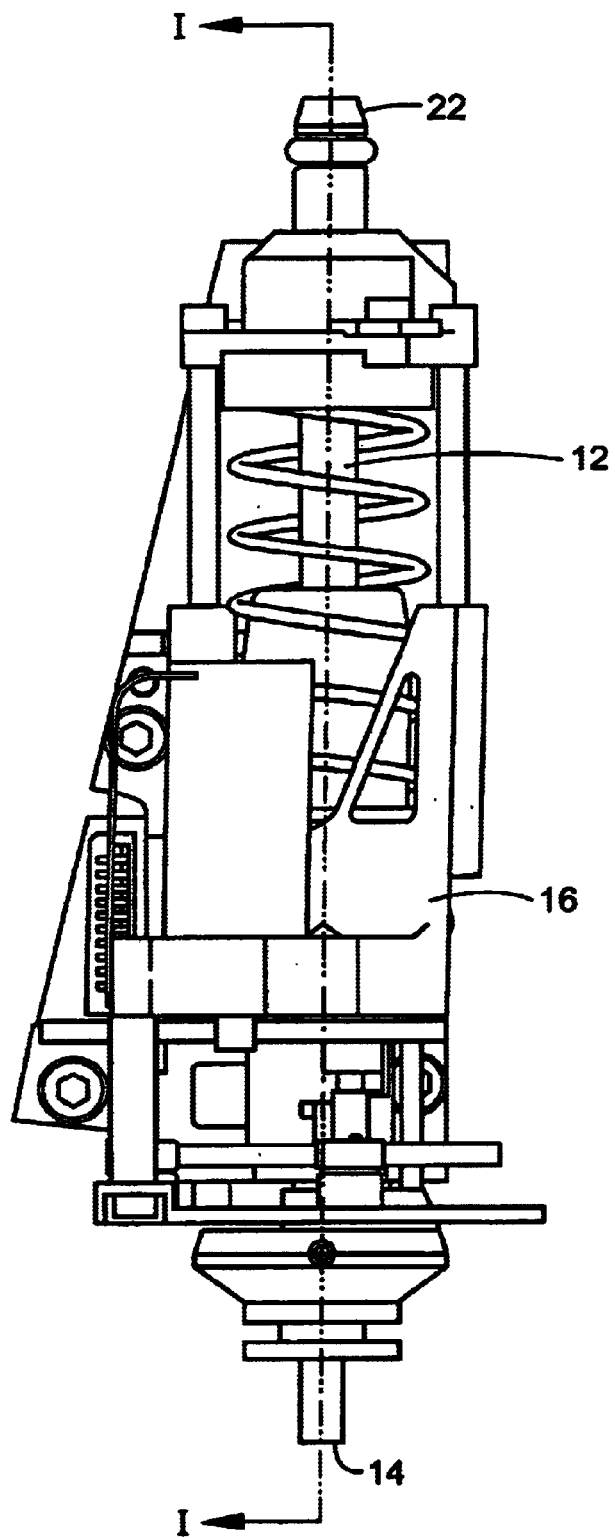
FIG. 2 is a side elevational view of a spindle assembly according to the preferred embodiments of the present invention.

FIG. 1 is a cross sectional view of a preferred exemplary embodiment of a spindle assembly 10 for a pick and place machine in accordance with the present invention. The cross sectional view is taken along line I—I of FIG. 2. The spindle assembly 10 is used in a pick and place head, for picking up electronic components and placing them at their intended locations during an assembly operation.

Turning attention now to FIG. 1, the spindle assembly 10 includes a frame or housing 16 which has a vertical cavity in which the spindle 12 is supported. At a lower end of the spindle 12 is a nozzle 14. The nozzle 14 is the portion of the spindle 12 that makes contact with the dies and components to be picked up by the spindle 12.

As can be seen in FIG. 1, at least a portion of the spindle 12 is hollow, thus creating an air passageway 15 through which a vacuum or air pressure may pass. The air passageway 13 of nozzle 14 connects to air passageway 15 allowing the flow of vacuum or air pressure through nozzle 14. The lower most end of the nozzle 14 is open so that the vacuum or air pressure may be applied to enable the die or component to be picked up and to be detached by the nozzle 14.

Figure 4:
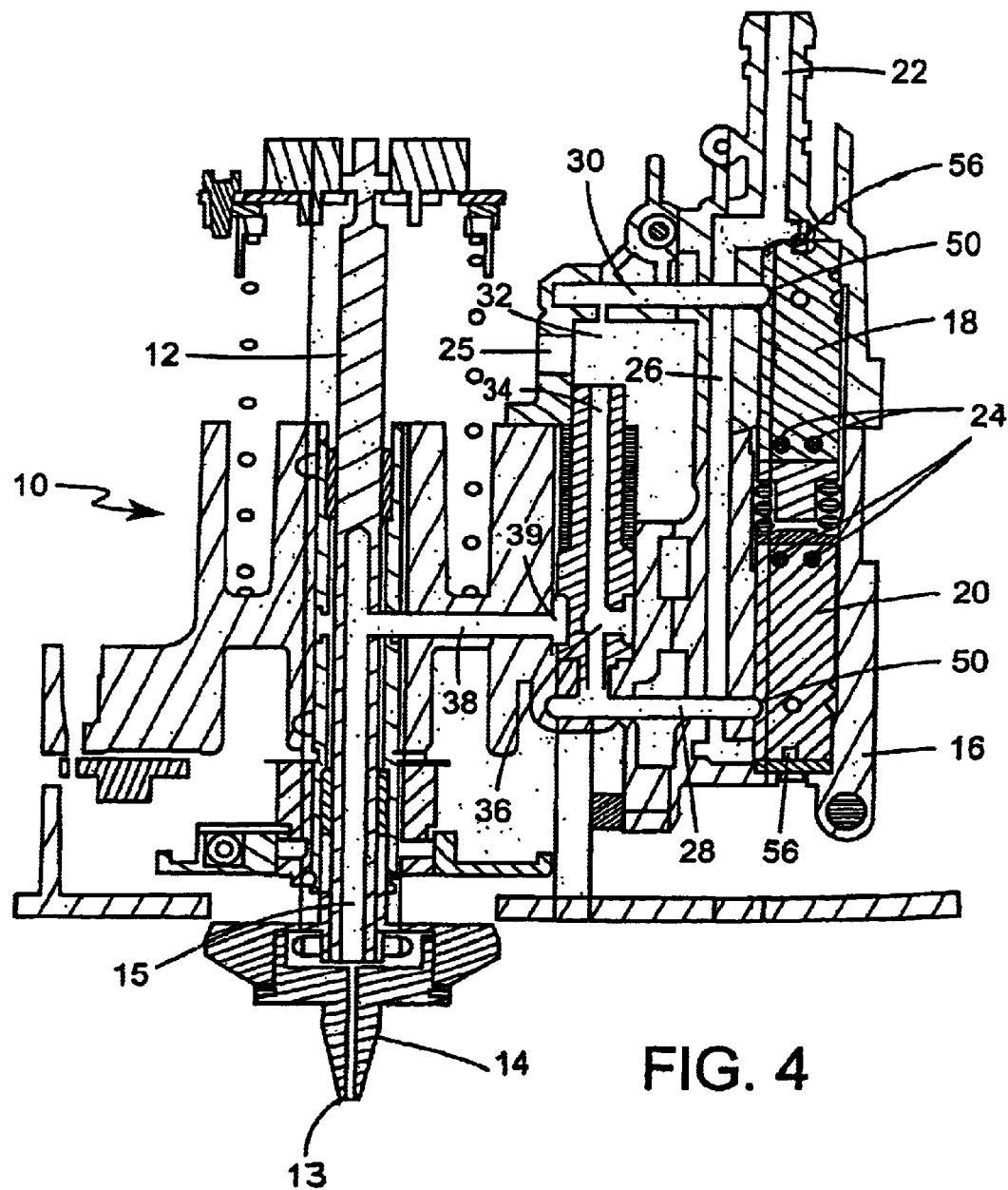
FIG. 4 is a schematic representation of the preferred embodiment of the present invention illustrating the air flow passages.

As can be seen in at least FIGS. 1 and 4, mounted on the housing 16 are two valves 18, 20. Each of the valves 18, 20 is connected to a source of pressurized air via air source passageway 22. Electrical contacts 24 are provided at one end of each valve 18, 20 so that an electric current can be applied to actuate the valve 18, 20. An air outlet port 50 is provided at a side of each of the valve bodies so as to allow compressed air to pass through the valves 18, 20.

According to a preferred embodiment of the present invention, it is possible to actuate the valves with a very short application of current. Specifically, the application of current for approximately 0.5 to 1 milliseconds at about 2.5 to 10 amps is sufficient to actuate the valves in order to open the valves. When the valves are actuated, air can flow from the air inlet port 56 through the valve body and out through the air outlet port 50.

In order to close the valve, a deactivating current is applied to the valve in an opposite polarity as the initial activating current. The deactivating current is less than the activating current. The deactivating current can be applied for about 0.1 to 0.5 milliseconds, preferably 0.12 milliseconds, at about 0.3 amps. Alternatively, the deactivating current can be a sequence of alternating degaussing currents. The preferred voltage for the valves is 12 volts. However, the present invention is not limited to the voltage, amp, and time values set forth above.

The present invention is not limited to the particular details of a valve. One of ordinary skill in the art would contemplate that other types of valves could be used according to the present invention. However, it is preferable that the valve used is of a small size and of a high speed.

Figure 3A:
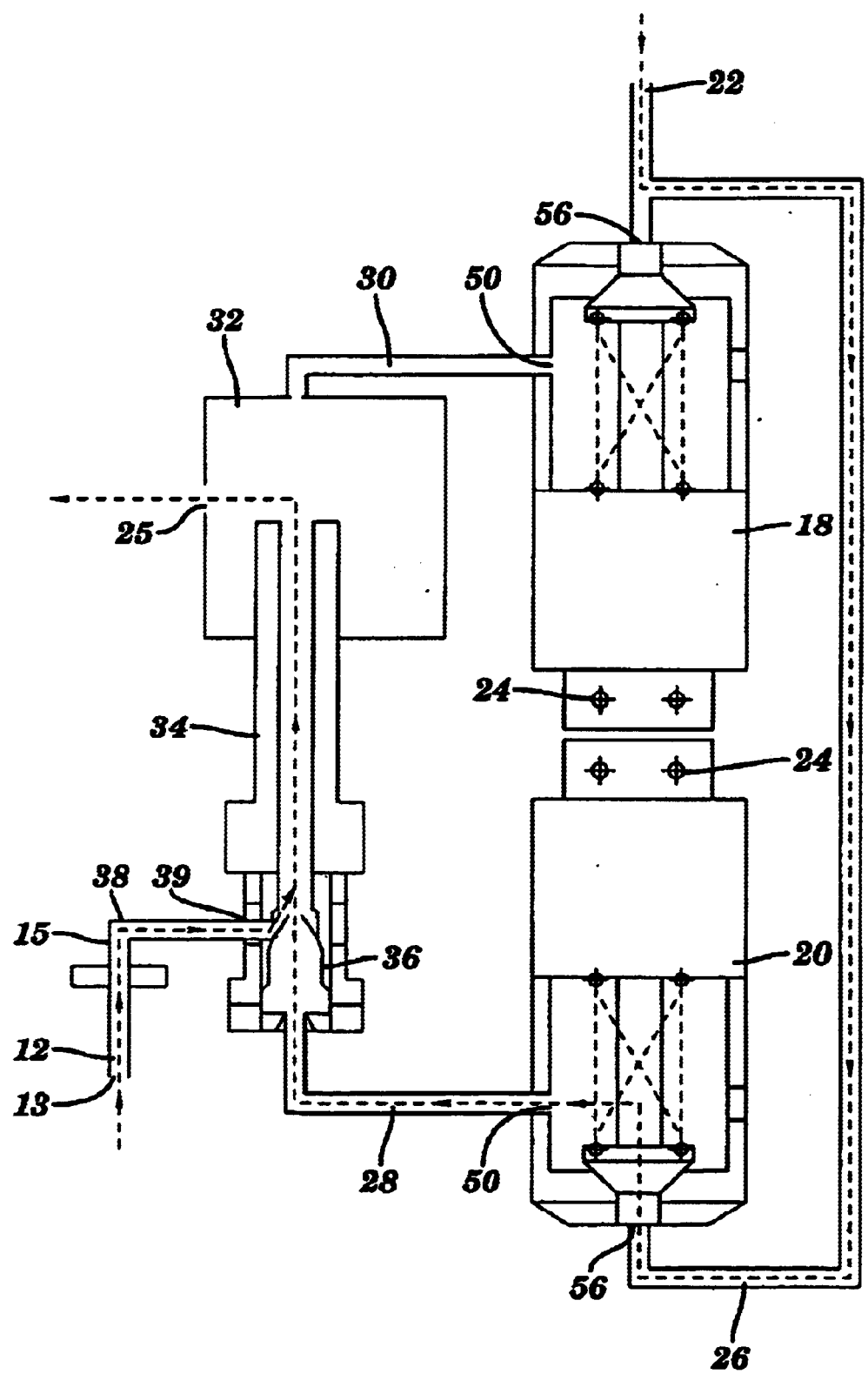
FIG. 3A is a schematic view of a spindle assembly, while a vacuum is applied, according to the preferred embodiments of the present invention.
Figure 3B:
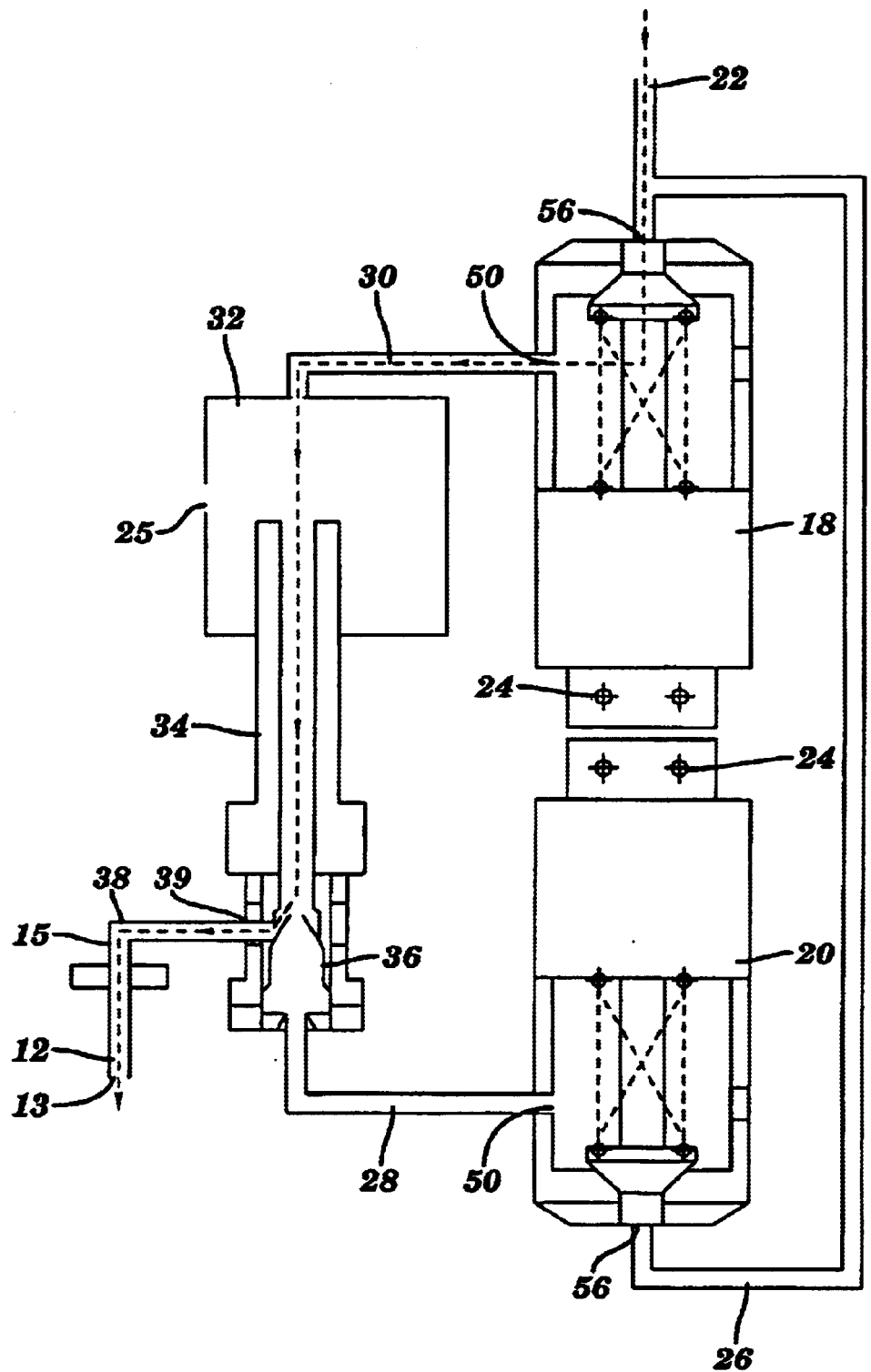
FIG. 3B is a schematic view of a spindle assembly, while an air kiss is applied, according to the preferred embodiments of the present invention.

Turning attention now to FIGS. 3A, 3B, and 4, an air flow circuit of an embodiment of the present invention is illustrated. The various components of the preferred embodiment of the present invention are illustrated in schematic form, and are not necessarily drawn to scale. An air source passageway 22 is connected to a source of pressurized air, and is used to deliver the pressurized air to the two valves 18, 20.

A venturi 36 is also mounted in the housing 16 of the spindle assembly 10. An air passageway 28 connects the air outlet port 50 of valve 20 with a first end of the venturi 36. The venturi 36 is constructed such that when an air pressure is delivered to the first end thereof, a vacuum is created at the opening 39 of the venturi 36. Another air passageway 38 connects the opening 39 of the venturi 36 to the spindle 12. Accordingly, when valve 20 is actuated so as to open the valve, pressurized air from air source passageway 22 passes through an air passageway 26 into the valve 20 and through the air passageway 28 into the venturi 36. A vacuum created by the venturi 36 is then applied to the spindle 12 through the air passageway 38.

An air passageway 34 extends from a second end of the venturi 36, through an expansion chamber 32, and leads to an air system that is used to cool a motor that drives the pick and place head. However, it is not necessary to use the air from the air passageway 34 to cool the motor.

The expansion chamber 32, in its simplest form, enables an expansion of an air pulse moving from the valve 18 to the spindle 12 so as to moderate the pressure thereof. In a preferred embodiment, the expansion chamber 32 includes an enclosed space that is fixed around the second end of the venturi 36. In the preferred embodiment, the expansion chamber includes an opening 25 in a side thereof through which air can escape. As seen in FIGS. 3A and 3B, the air passageway 34 extends through this opening 25. Another air passageway 30 interconnects the output of valve 18 to the expansion chamber 32. The air passageway 30 is constructed such that it ends at a short distance from the second end of the venturi 36. This short distance is instrumental in moderating pulses of air passing from the air passageway 30 to the venturi 36. However, it will be appreciated that alternative arrangements can be used to moderate the air pressure.

When the valve 18 is actuated so as to open the valve, compressed air from the air source passageway 22 passes through the valve 18 and through the air passageway 30 into the expansion chamber 32. Since the second end of the venturi 36 is spaced from the air passageway 30, when the pressurized air from the valve 18 and air passageway 30 enters the expansion chamber 32, the air pressure is moderated before it enters the venturi 36, and a gentle pulse of air passes through the venturi 36 into the air passageway 38 and to the spindle 12. Accordingly, a pulse of air can be delivered to the spindle 12 by activating valve 18. The pulse of air passes through the valve 18, the air passageway 30, the expansion chamber 32, the venturi 36, the air passageway 38 to the spindle 12. The arrangement of the expansion chamber 32, including the volume, position, distance, and exhaust opening 25, is selected in such a way as to moderate the pulse of air emitted from the valve 18. Accordingly, the expansion chamber 32 moderates the pulse of air and prevents an unnecessarily abrupt pulse of air from being applied to the spindle 12.

In a preferred embodiment, the expansion chamber 32 has an internal volume of approximately 450 cubic millimeters.

In an alternative embodiment of the present invention, the second end of the venturi 36 can be connected directly to the air passageway 34, and bypassing the expansion chamber 32. In such an embodiment, an air passage from the expansion chamber 32 would be directly connected to the spindle 12. Accordingly, the pulse of air could be directed through the expansion chamber 32 and directly into the spindle 12, without having to pass through the venturi 36.

Because of the small, lightweight size of the valves 18, 20, the valves can be actuated within about 0.5 to 0.8 milliseconds. However, in alternative embodiments of the present invention, the valves may be actuated within one or two milliseconds, or other suitable times.

In a preferred embodiment of the present invention, each of the valves weighs approximately 4 grams, has a length of approximately 19 millimeters, and a diameter of 9 millimeters. However, the present invention is not limited to such valves, and valves of alternative sizes and weights may be used in accordance with the present invention. The valves of the preferred embodiment are manufactured by Sturman Industries of Woodland Park, Colo.

Because of the small size of the valves 18, 20, the valves 18, 20 may be located in the housing 16 for the spindle assembly 10, thus enabling the valve 18, 20 to be arranged very close to the spindle 12. In another preferred embodiment of the present invention, the valves 18, 20 are approximately 2 inches from the spindle 12. However, in alternative embodiments, the valves 18, 20 may be 5, 4, or 3 inches, or less, from the spindle 12. Because the distance between the valves 18, 20 and the spindles 12 is small, there is a relatively small volume of air in the connecting passageways that needs to be evacuated during each activation. In one embodiment, the total volume in the passageways to be evacuated is about 500 cubic millimeters. Accordingly, actuation time is decreased by placing the valves 18, 20 close to the spindles 12. The, small size of the valves 18, 20, the fast changeover time, and the close proximity of the valves 18, 20 to the spindle 12 all account for very fast turnover speed.

In a further aspect of the present invention, as can be seen in the preferred exemplary embodiment illustrated in FIG. 4, the passageways can be formed directly in the frame or housing 16. Specifically, instead of providing tubing to channel the air flows throughout the system, the preferred exemplary embodiment includes passageways that are drilled, bored, molded or otherwise formed in the housing itself in order to direct the air flows throughout the system.

In one embodiment, the housing 16 is molded from polyetherimide. For example, plastic sold under the tradename ULTEM™ by GE Plastics may be used. In such an embodiment, some or all of the passageways, such as passageways 22, 26, 28, 30, 34, and 38, are either molded directly into the housing 16 or are drilled into the housing 16 after the housing is molded. Preferably, some of the passageways will be molded directly in the housing 16 and others will be drilled.

Alternatively, the housing 16 can be machined from a block of plastic. Or, the housing 16 can be molded, and after the molding process, further details of the housing can be machined.

In the preferred disclosed embodiments, two valves are utilized. However, an embodiment could be used with only one valve, or more than two valves. The one valve would control only the vacuum pressure applied to the spindle. In such an embodiment, no air pulse would be available to dislodge the component from the spindle tip during placement. Such an embodiment is more useful for apparatus intended to move larger components that could easily dislodge from the spindle by gravity alone.

Although only preferred embodiments are specifically illustrated and described herein, it will be appreciated that many modifications and variations of the present invention are possible in light of the above teachings and within the purview of the appended claims, without departing from the spirit and intended scope of the invention.

What is claimed is:

1. A spindle assembly for a component pick and place machine, the spindle assembly comprising:

a housing containing a spindle for movement therein along a longitudinal axis of the spindle;

the housing accommodating at least one valve, spaced from the spindle, for controlling the flow of air to an inner bore of the spindle;

the inner bore of the spindle having an opening at one end for communicating the flow of air, for assisting of picking and placing a component; and the flow of air between the at least one valve and the inner bore of the spindle is through passageways, wherein the passageways are integrally formed as part of the housing.

2. The spindle assembly according to claim 1, wherein the flow of air creates a vacuum.

3. The spindle assembly according to claim 1, wherein the at least one valve is three inches or less from the spindle.

4. The spindle assembly according to claim 1, wherein the at least one valve is adapted to switch from a fully open position to a fully closed position or vice versa in less than two milliseconds.

5. The spindle assembly of claim 1, further comprising a venturi in the passageways to create a vacuum pressure at the spindle.

6. The spindle assembly of claim 3, wherein the air flow at the tip of the spindle is a vacuum pressure for holding the component or an air pressure for detaching the component.

7. The spindle assembly according to claim 1, wherein the at least one valve is adapted to switch from a fully open position to a fully closed position or vice versa in 0.8 milliseconds or less.

8. The assembly of claim 1, further comprising an expansion chamber; and the passageways include:

a first branch interconnecting a first of the at least one valve with a first end of the venturi so that air applied to the first end of the venturi creates a vacuum that is applied to the spindle; and a second branch interconnecting a second of the at least one valve with a second end of the venturi so that air applied to the second end of the venturi creates a pulse of air at the spindle;

a third branch interconnecting the venturi with the spindle; and the expansion chamber is arranged between the second of the at least one valve and the spindle to moderate changes in air pressure applied to the spindle.

9. The spindle assembly according to claim 1, wherein at least some of the passageways are drilled into the housing.

10. The spindle assembly according to claim 1, wherein at least some of the passageways are molded into the housing.

* * * * *